United States Patent
Chang et al.

(10) Patent No.: US 9,287,279 B2
(45) Date of Patent: Mar. 15, 2016

(54) SILICON NITRIDE (SIN) ENCAPSULATING LAYER FOR SILICON NANOCRYSTAL MEMORY STORAGE

(71) Applicant: Taiwan Semiconductor Manufacturing Co., Ltd., Hsin-Chu (TW)

(72) Inventors: Yu-Hsing Chang, Taipei (TW); Chang-Ming Wu, New Taipei (TW); Shih-Chang Liu, Alian Township (TW); Chia-Shiung Tsai, Hsin-Chu (TW); Ru-Liang Lee, Hsinchu (TW); Wei Cheng Wu, Zhubei (TW); Harry-Hak-Lay Chuang, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/225,874

(22) Filed: Mar. 26, 2014

(65) Prior Publication Data

US 2015/0279849 A1 Oct. 1, 2015

(51) Int. Cl.
*H01L 27/115* (2006.01)
*H01L 29/788* (2006.01)
*H01L 21/28* (2006.01)

(52) U.S. Cl.
CPC .... *H01L 27/11521* (2013.01); *H01L 21/28273* (2013.01); *H01L 29/788* (2013.01)

(58) Field of Classification Search
CPC .................... H01L 29/7831; H01L 29/66484; H01L 21/82

USPC .................................................. 257/314–326
See application file for complete search history.

(56) References Cited

U.S. PATENT DOCUMENTS 7,915,666 B2 * 3/2011 Yasui et al. .................... 257/324

OTHER PUBLICATIONS

Oda, Shunri. "Silicon Quantum Dot Devices." Proc. 26th International Conference on Microelectronics (MIEL 2008), NIŠ, Serbia, May 11-14, 2008.
Tiwari, et al. "A Silicon Nanocrystals Based Memory." Appl. Phys. Lett. 68 (10), Mar. 4, 1996.

* cited by examiner

*Primary Examiner* — Cuong Q Nguyen
(74) *Attorney, Agent, or Firm* — Eschweiler & Associates, LLC

(57) ABSTRACT

Some embodiments relate to a memory cell with a charge-trapping layer of nanocrystals, comprising a tunneling oxide layer along a select gate, a control oxide layer formed between a control gate and the tunnel oxide layer, and a plurality of nanocrystals arranged between the tunneling and control oxide layers. An encapsulating layer isolates the nanocrystals from the control oxide layer. Contact formation to the select gate includes a two-step etch. A first etch includes a selectivity between oxide and the encapsulating layer, and etches away the control oxide layer while leaving the encapsulating layer intact. A second etch, which has an opposite selectivity of the first etch, then etches away the encapsulating layer while leaving the tunneling oxide layer intact. As a result, the control oxide layer and nanocrystals are etched away from a surface of the select gate, while leaving the tunneling oxide layer intact for contact isolation.

20 Claims, 8 Drawing Sheets

SILICON NITRIDE (SIN) ENCAPSULATING LAYER FOR SILICON NANOCRYSTAL MEMORY STORAGE

BACKGROUND

The present disclosure relates to FLASH memory, and in particular, to a FLASH memory cell architecture that utilizes threshold voltage shifting from charge stored in silicon nanocrystals.

FLASH memory is used in a wide variety of electronic applications. Some FLASH memory cells utilize a floating gate field-effect transistor (FET), which stores one or more bits of data in the form of an electric charge within a "floating" gate. The floating gate resides above a channel of, and below a control gate of, the FET, but is electrically-isolated from both by an oxide layer. The memory cell stores charge when the FET is in an "on" state (i.e., when current flows between the source and drain) by applying a voltage to the control gate, which causes electrons to tunnel from the channel into the floating gate. Because the floating gate is electrically-isolated from the channel and the control gate, electrons that tunnel into it will remain there indefinitely.

Electric charge trapped within the floating gate screens the electric field from the control gate within the channel, which increases the threshold voltage ($V_t$) of the FET. For FLASH memory devices that use an array of memory cells, the stored data can be read out of the array by measuring which cells experience $V_t$ increase (e.g., store a "1") and which don't (e.g., store a "0").

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2K illustrate a series of cross-sectional views that collectively depict forming the memory device of FIGS. 1A-1B.

DETAILED DESCRIPTION

Figure 1A:
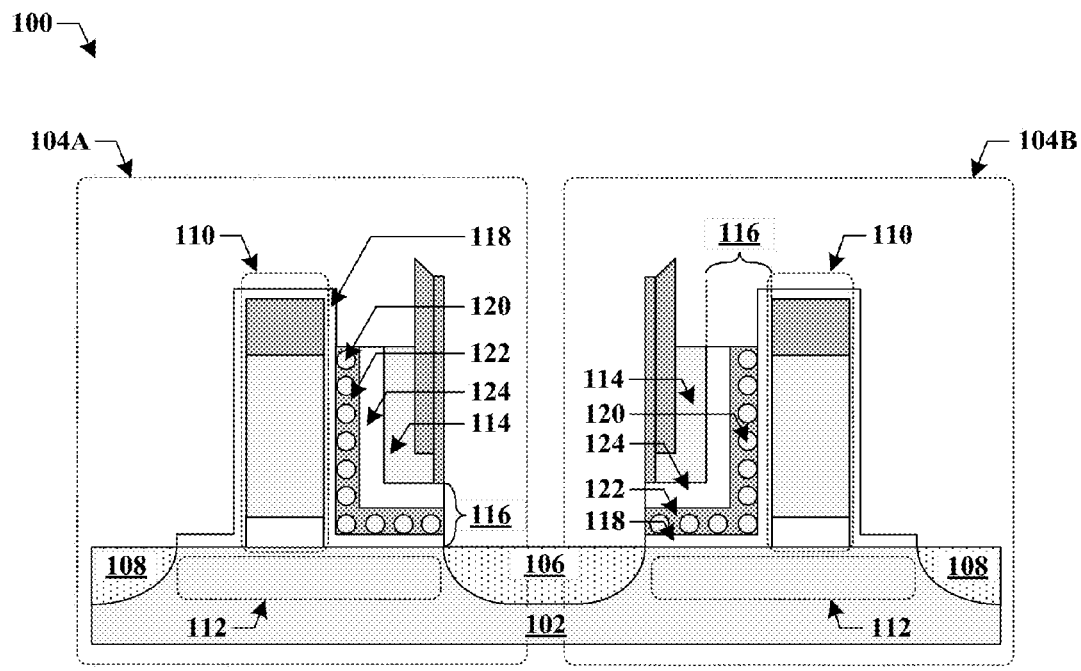
FIGS. 1A-1B illustrate some embodiments of a memory device.

The following disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some FLASH memory cells utilize a charge-trapping memory layer containing a plurality of silicon nanocrystals embedded within an oxide layer. The oxide layer is situated between a control gate and a select gate, and electrically-isolates the silicon nanocrystals from both. The nanocrystals have an advantage over some conventional memory storage elements, such as a floating gate, because they minimize leakage, and hence improve memory data retention. While a floating gate is a continuous layer, at least some of the nanocrystals are spaced apart from one-another within the oxide layer. For example, they may tend to form "clumps" with small gaps between adjacent clumps. As a result, a leakage path from a single nanocrystal or single clump results in only the loss of charge stored within that nanocrystal, not the entire memory element.

The control and select gates collectively enable writing, reading, and erasing data from the silicon nanocrystals by independently biasing each gate, which requires an independent contact to each gate. Contact formation to the select gate utilizes an etch to through the oxide layer to remove silicon nanocrystals along a portion of the select gate, while leaving enough oxide over the select gate to electrically-isolate it from the contact. This can be achieved through a well-controlled etch rate. However, the silicon nanocrystals are typically distributed randomly throughout the oxide layer. Therefore, because silicon and oxide etch at different rates, the etch rate varies throughout the oxide layer depending on the concentration of silicon nanocrystals. As a result, the etch rate of the oxide layer is not well-controlled.

Some embodiments of the present disclosure relate to a FLASH memory storage cell comprising a charge-trapping layer formed between a control gate and a select gate. The charge-trapping layer comprises a tunneling oxide layer formed along a surface of the select gate, a control oxide layer formed between the control gate and the tunnel oxide layer, and a plurality of silicon nanocrystals arranged between the tunneling oxide layer and the control oxide layer, which are configured to store charge. An insulating encapsulating layer with a different material composition than the control and tunneling oxide layers encapsulates the silicon nanocrystals, thereby isolating them from the control oxide layer. Contact formation to the select gate includes an etch though the control oxide layer to remove silicon nanocrystals from over a portion of the select gate. The encapsulating layer is configured to act as an etch stop layer to control and terminate an etch through the control oxide layer. As a result, the etch control oxide layer is well-controlled, thus leaving the tunneling oxide layer substantially-intact after the control oxide etch to electrically-isolate the select gate from a subsequently-formed contact.

FIG. 1A illustrates a cross-sectional view of some embodiments of a memory device 100 formed on a semiconductor substrate 102, comprising a pair of the memory cells 104A, 104B having a shared common source region 106 and individual drain regions 108. Each memory cell 104A, 104B includes a select gate 110 formed over the surface of the semiconductor substrate 102 between the common source 106 and individual drain regions, which are laterally separated by a channel region 112 formed beneath the select gate 110. A control gate 114 is formed along a portion of a sidewall of the select gate 110. A charge-trapping layer 116 separates the control gate 114 from the select gate 110, and is configured to store electric charge in response to independent biasing of the select and the control gates 110, 114.

Figure 1B:
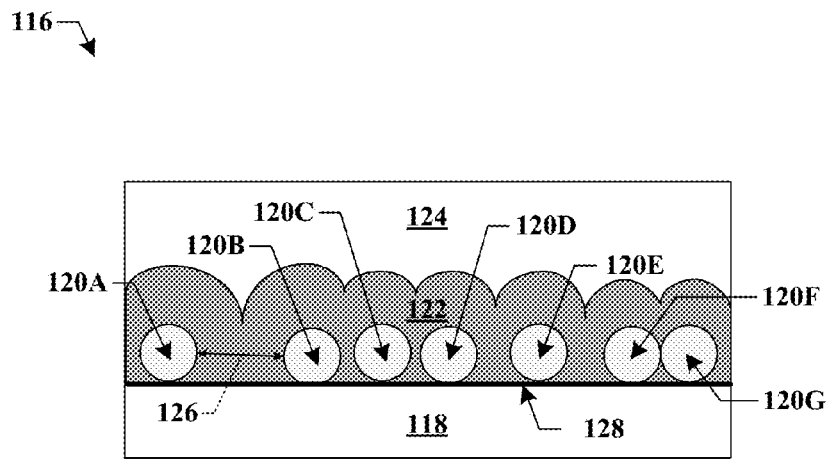

The charge-trapping layer 116 comprises a tunneling oxide layer 118 formed along surfaces of the select gate 110 (i.e., sidewalls and a top surface) and the surface of a semiconductor substrate 102, between the select gate 110 and the common source region 106, and between the select gate 110 and the drain regions 108. A plurality of silicon nanocrystals 120 are formed along a portion of the surface of the tunneling oxide layer 118. The silicon nanocrystals 120 are formed on the surface of the tunneling oxide layer 118 along a lower portion of the sidewall of the select gate 110 that faces the common source region 106, and on the surface of the tunneling oxide layer 118 between the select gate 110 and the common source region 106. The silicon nanocrystals 120 are configured to store different amounts of charge (i.e., electrons) depending upon independent biases applied to the select and the control gates 110, 114. An encapsulating layer 122 embeds and surrounds the silicon nanocrystals 120, and is isolated from the select gate 110 by the tunneling oxide layer 118. A control oxide layer 124 is formed along a surface the encapsulating layer 122, and isolates the encapsulating layer 122 from the control gate 114. Some embodiments of the charge trapping layer 116 are illustrated in FIG. 1B.

The charge-trapping layer 116 has advantages over some conventional approaches. In particular, as will be further demonstrated in FIGS. 2A-2J, contact formation to the select and the control gates 110, 114 utilizes a well-controlled etch through the charge-trapping layer 116 to remove a portion of the control oxide layer 124 and underlying silicon nanocrystals 120, while leaving the tunneling oxide layer 118 intact. To achieve this, a two-step selective etch is used that utilizes etch selectivity between the encapsulating layer 122 and the oxide of the tunneling and control oxide layers 118, 124. In the absence of the encapsulating layer 122 such a well-controlled two-step etch is not possible.

Independent biasing of the select and the control gates 110, 114 allows for writing, reading, and erasing data from the memory device 100. In a write mode of operation of the memory device 100, a voltage applied to the select gate 110, which allows electrons to move between the common source and drain regions 106, 108 and through the channel region 112 of each memory cell 104A, 104B. An independent voltage is then applied to the control gate 114, which promotes tunneling of some the electrons from the channel region 112, through the tunneling oxide layer 118, and into the silicon nanocrystals 120. The electrons are consequently stored within the silicon nanocrystals 120 indefinitely.

The charge resulting from the stored electrons screens an electric field formed between the select gate 110 and the channel region 112 when the select gate 110 is biased. This has an effect of increasing the threshold voltage ($V_t$) of memory cells 104A, 104B by an amount $\Delta V_t$ that is proportional to the thickness of the control oxide layer 124. In a read mode of operation of the memory device 100, the threshold voltage increase can be used to sense stored charge within each memory cell 104A, 104B. By applying a voltage ($V_{SG}$) to the select gate 110 that is greater than $V_t$, but less than $V_t+\Delta V_t$, the stored state within each memory cell 104A, 104B can be sensed. If the memory cell 104A, 104B turns on, then it stores a "0" (e.g., no bit). If the memory cell 104A, 104B does not turn on, then it stores a "1" (e.g., one bit).

In an erase mode of operation of the memory device 100, a voltage applied to the control gate 114, while no voltage is applied to the select gate 110, which allows the electrons to tunnel from the silicon nanocrystals 120, through the control oxide layer 124, and into the control gate 114. As a result, the charge is removed from the silicon nanocrystals 120 and the memory cells 104A, 104B are erased.

FIG. 1B illustrates a cross-sectional view of the charge-trapping layer 116 of the memory device 100 of FIG. 1A. The encapsulating layer 122 is a continuous layer that covers a plurality of silicon nanocrystals 120A-120G. In some embodiments, the plurality of silicon nanocrystals 120A-120G abut a surface 128 of the tunneling oxide layer 118. In some embodiments, the encapsulating layer 122 comprises silicon nitride (SiN), and has a thickness in a range of about one nm to about 10 nm.

The plurality of silicon nanocrystals 120A-120G are spherically-shaped and are distributed randomly within the encapsulating layer 122, such that a distance 126 between an adjacent pair of silicon nanocrystals from the plurality of silicon nanocrystals 120A-120G varies throughout the encapsulating layer 122. In some instances, the distance 126 can be zero, as illustrated by the adjacent pair of silicon nanocrystals 120F, 120G, which touch one-another. In some embodiments, the diameter of each silicon nanocrystal 120A-120G also varies throughout the encapsulating layer 122. The encapsulating layer 122 alone does not isolate the plurality of silicon nanocrystals 120A-120G from the select and control gates 110, 114. However, the tunneling oxide layer 118 and encapsulating layer 122 in combination completely embed and surround the plurality of silicon nanocrystals 120A-120G to isolate them from both the select and control gates 110, 114.

It is appreciated that the cross-sectional view of the charge-trapping layer 116 of FIG. 1B is merely a cartoon illustration to demonstrate various properties of the charge-trapping layer 116. Real images and measurements of the charge-trapping layer 116 may be obtained using techniques such as transmission electron spectroscopy (TEM), scanning electron microscopy (SEM), atomic force microscopy (AFM), or other technique.

Figure 2B:
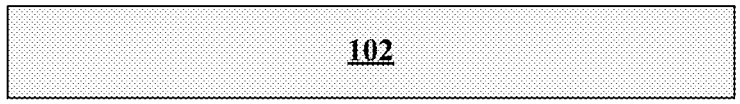
Figure 2B:
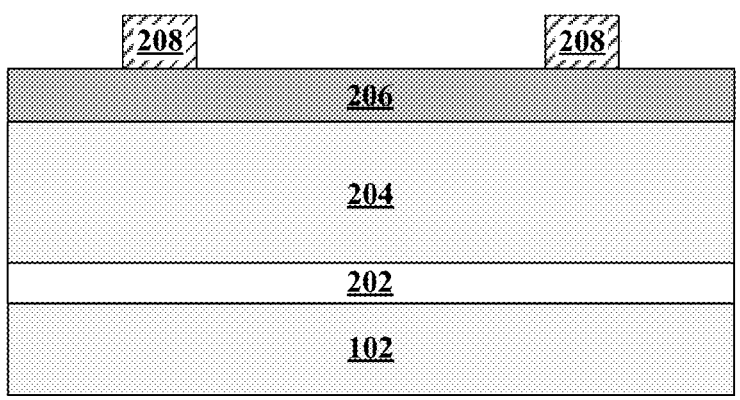
Figure 2C:
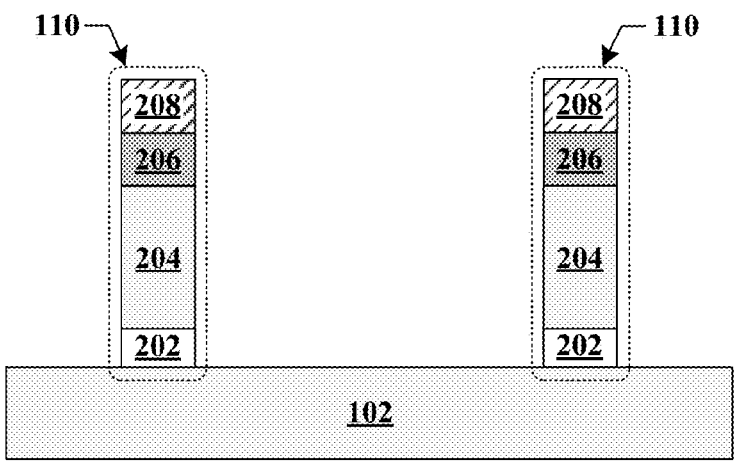

FIGS. 2A-2K illustrate a series of cross-sectional views that collectively depict forming the memory device of FIGS. 1A-1B. In FIG. 2A a semiconductor substrate 102 (e.g., Si) is provided. In FIG. 2B a gate oxide layer 202 (e.g., $SiO_2$) is formed over the surface of the semiconductor substrate 102, a gate electrode layer 204 (e.g., polysilicon) is formed over the gate oxide layer 202, and a gate capping layer 206 (e.g., SiN) is formed over the gate electrode layer 204. A mask pattern is formed in photoresist 208 over the gate capping layer 206, which forms a pattern of select gate structures. In FIG. 2C the gate capping layer 206, gate electrode layer 204, and gate oxide layer 202 are etched through the mask pattern of photoresist 208 to define a pair of select gates 110.

Figure 2D:
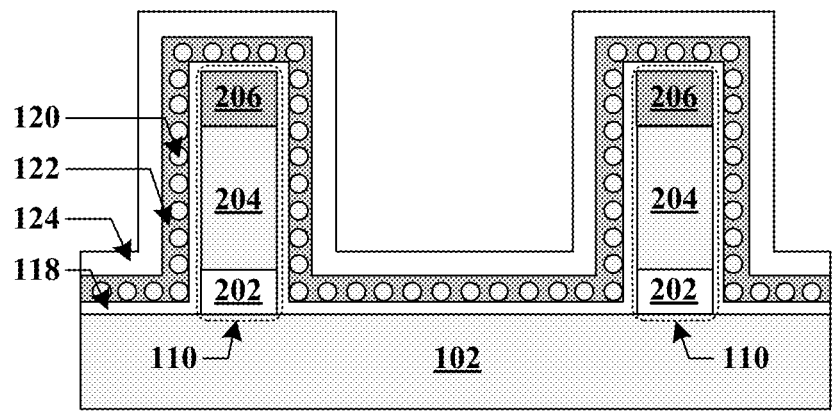

In FIG. 2D, after forming the pair of select gates 110, a tunneling oxide layer 118 (e.g., $SiO_2$) is formed on a top surface and sidewalls of the select gates 110 and on the surface of the semiconductor substrate 102. A plurality of silicon nanocrystals 120 are then formed on a surface of the tunneling oxide layer 118. An encapsulating layer 122 (e.g., SiN) is then formed on the tunneling oxide layer 118 and silicon nanocrystals 120. In some embodiments, the encapsulating layer 122 is formed by atomic layer deposition (ALD), chemical vapor deposition (CVD), or physical vapor deposition (PVD). The encapsulating layer 122 covers the silicon nanocrystals 120, fills spaces between adjacent silicon nanocrystals 120, and fills spaces between the silicon nanocrystals 120 and the tunneling oxide layer 118. A control oxide layer 124 (e.g., $SiO_2$) is then formed on a surface of the encapsulating layer 122.

Figure 2E:
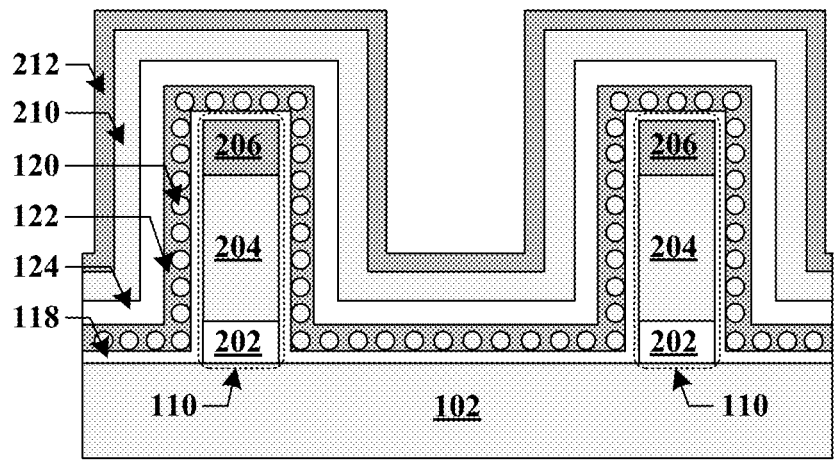
Figure 2F:
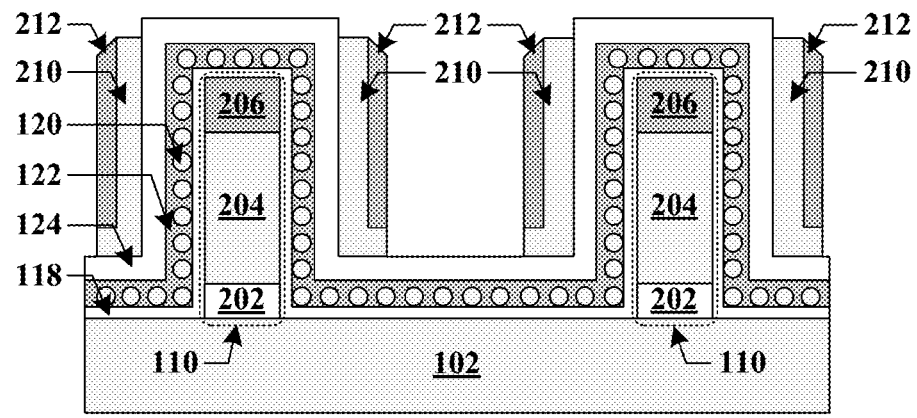
Figure 2G:
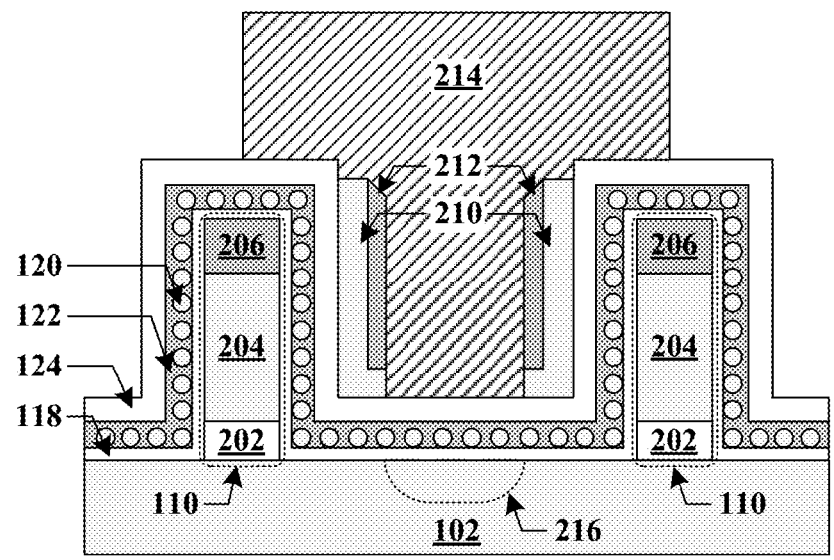

In FIG. 2E a control gate layer 210 (e.g., polysilicon) is formed on the control oxide layer 124. The control gate layer 210 is isolated from the silicon nanocrystals 120 by the encapsulating layer 122. A spacer layer 212 (e.g., SiN) is then formed on the control gate layer 210. In FIG. 2F portions of the control gate layer 210 and spacer layer 212 are removed from the top surface of the select gates 110 and the surface of the semiconductor substrate 102 through one or more etch steps. In FIG. 2G, after removing portions of the control gate layer 210 and spacer layer 212, a mask layer 214 (e.g., photoresist) is formed over a portion of the top surface of the select gate 110 and a source region 216 of the semiconductor substrate 102. Portions of the spacer layer 212 and the control gate layer 210 are then removed from areas not covered by the mask layer 214.

Figure 2H:
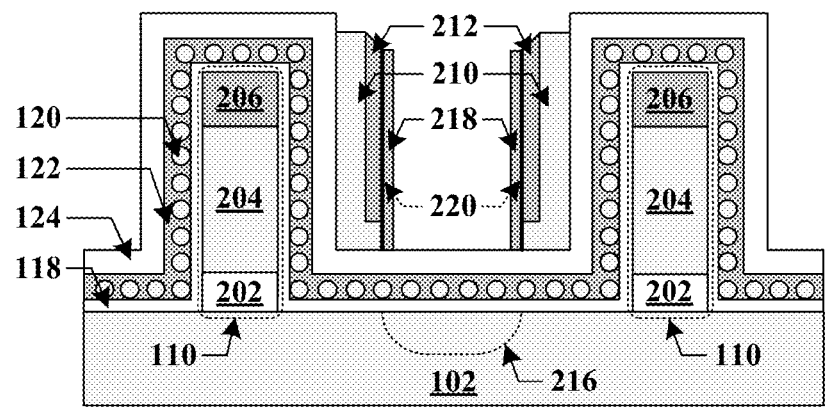
Figure 2I:
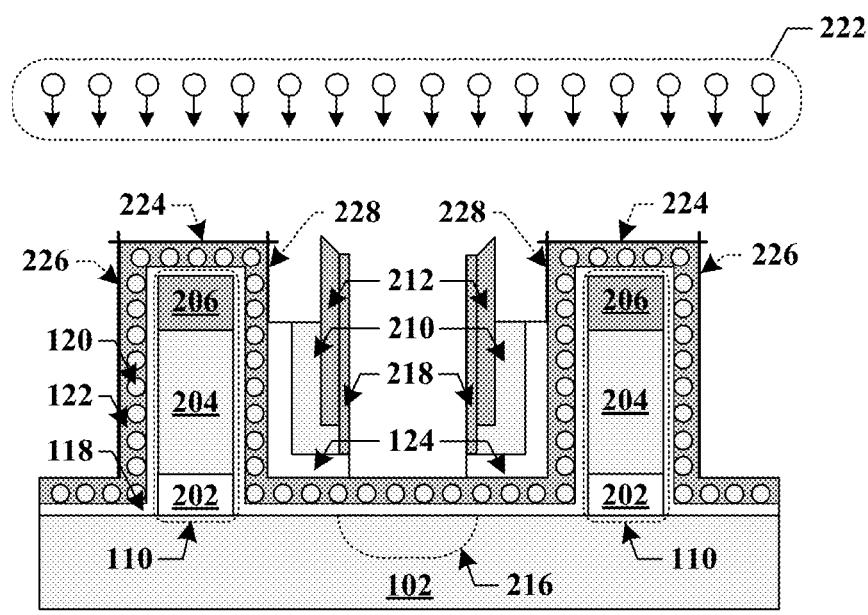

In FIG. 2H the mask layer 214 is removed and a second spacer layer 218 (e.g., SiN) is formed along a surface 220 of the exposed control gate layer 210 and spacer layer 212 facing the source region 216. In FIG. 2I the substrate 102 is exposed to a first etchant 222, which removes the control oxide layer 124 and the control gate layer 210 from the top surface 224 and drain-facing sidewall 226 of the select gates 110, and from an upper portion of a source-facing sidewall 228 of the select gates 110. The first etchant 222 has a first selectivity between the control oxide layer 124 and the encapsulating layer 122 such that it etches away the control oxide layer 124 while leaving the encapsulating layer 122 substantially intact. In some embodiments, the first etchant 222 comprises hydrofluoric acid (HF).

Figure 2J:
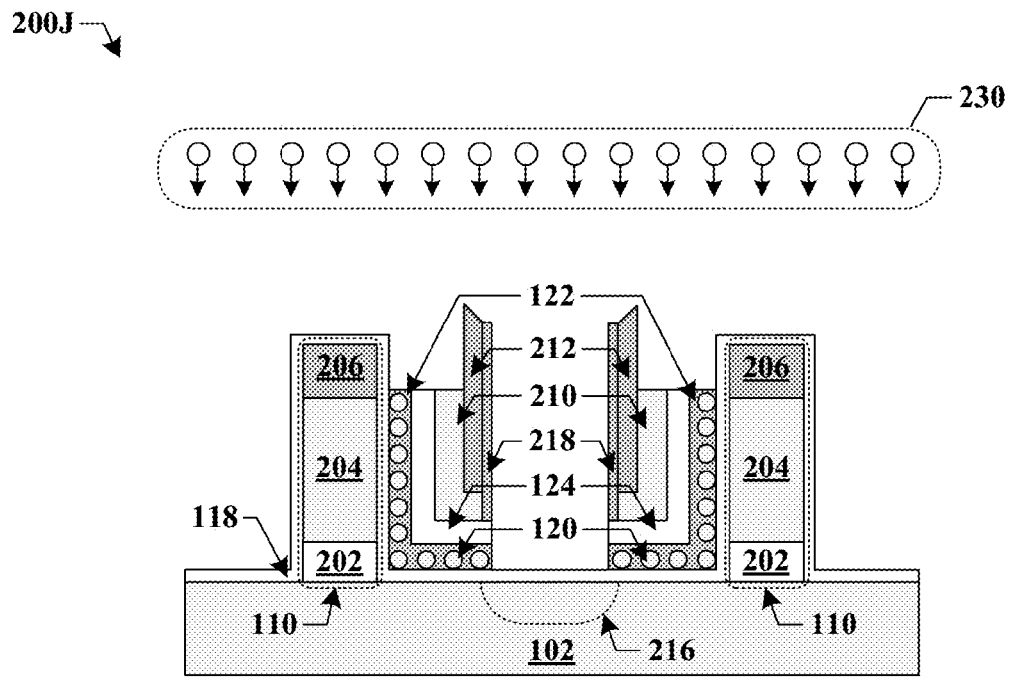

In FIG. 2J, after exposing the substrate 102 to a first etchant 222, the substrate 102 is exposed to a second etchant 230, which removes portions of the encapsulating layer 122 and silicon nanocrystals 120 exposed by the removal of the control oxide layer 124 and the control gate layer 210. The second etchant 230 has a second selectivity between the encapsulating layer 122 and tunneling oxide layer 118, which is opposite the first selectivity, such that it etches away the encapsulating layer 122 while leaving the tunneling oxide layer 118 substantially intact.

In some embodiments, the second etchant 230 comprises a remote plasma of one or more hydrofluorocarbons (CxHyFz) and oxygen ($O_2$), which is delivered through an isotropic Chemical Dry Etch (CDE). The CDE conditions are tuned to minimize damage to the tunneling oxide layer 118 substantially while removing the encapsulating layer 122. The CDE conditions include: a plasma source in a range of about 2 and 3 GHz, a pressure in a range between about 100 and 1,000 milliTorr (mT), a hydrofluorocarbon/oxygen ratio in a range of about 0.1 and 2, a combined hydrofluorocarbon and oxygen flow, which results in a flow rate in a range of about 100 to 1,000 standard cubic centimeter per minute (sccm). These CDE conditions result in a selectivity between the silicon and nitride and oxide of greater than about 5:1, such that the SiN encapsulating layer 122 is etched greater than about 5× as fast as the tunneling oxide layer 118.

Figure 2K:
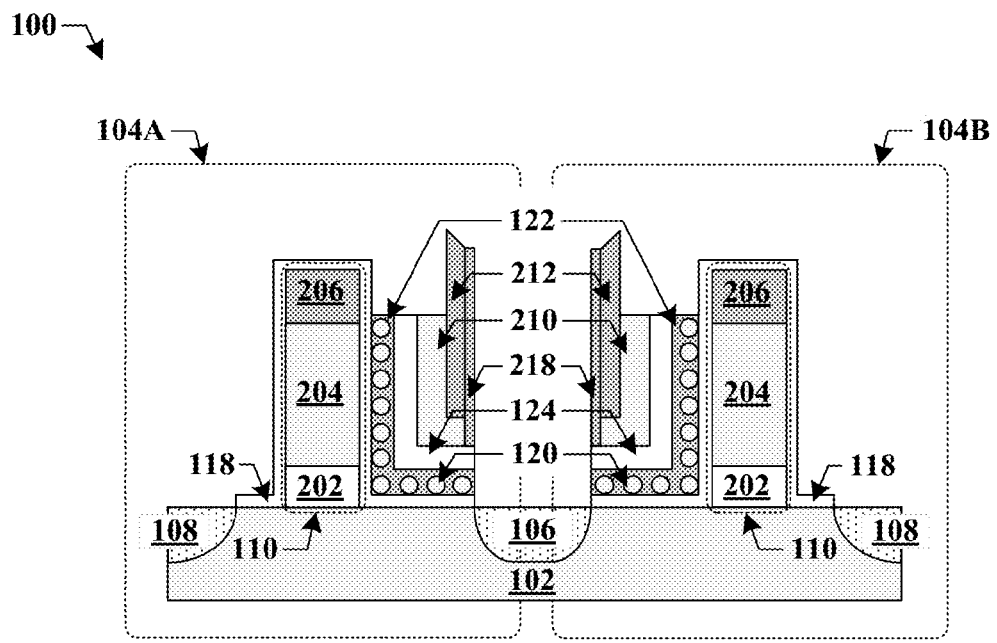

In FIG. 2K, after exposure to the first and second etchants 222, 230, a common source 106 and individual drain regions 108 are formed, resulting in the pair of the memory cells 104A, 104B of the memory device 100 of FIG. 1A. Within the memory device 100, the tunneling oxide layer 118 of each memory cell 104A, 104B forms a continuous shape along the common source facing sidewall of the select gate 110 and over the surface of the semiconductor substrate 102 between the select gate 110 and the common source 106. The encapsulating layer 122 within each memory cell 104A, 104B also forms a continuous shape along a lower portion of the sidewall and over the surface of the substrate 102 between the select gate 110 and the common source 106, and is separated from the sidewall and surface by the tunneling oxide layer 118. The control oxide layer 124 within each memory cell 104A, 104B also forms a continuous shape along the lower portion of the sidewall and over the surface between the select gate 110 and the common source 106, and is separated from the tunneling oxide layer 118 by the encapsulating layer 122.

Figure 3A:
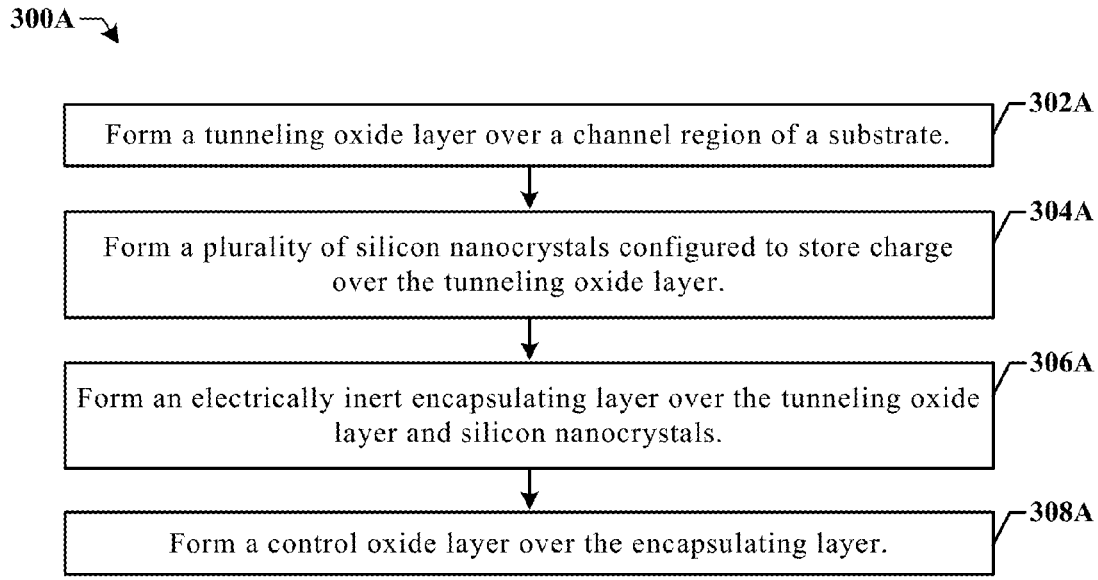
FIGS. 3A-3B illustrate methods of forming and etching a charge-trapping layer.

FIG. 3A illustrates a method 300A of forming a charge-trapping layer.

At 302A a tunneling oxide layer is formed over a channel region of a substrate.

At 304A a plurality of silicon nanocrystals configured to store charge are formed over the tunneling oxide layer.

At 306A an encapsulating layer is formed over the tunneling oxide layer and silicon nanocrystals, which covers the silicon nanocrystals, fills spaces between adjacent silicon nanocrystals, and fills spaces between the silicon nanocrystals and the tunneling oxide layer.

At 308A a control oxide layer is formed over the encapsulating layer.

Figure 3B:
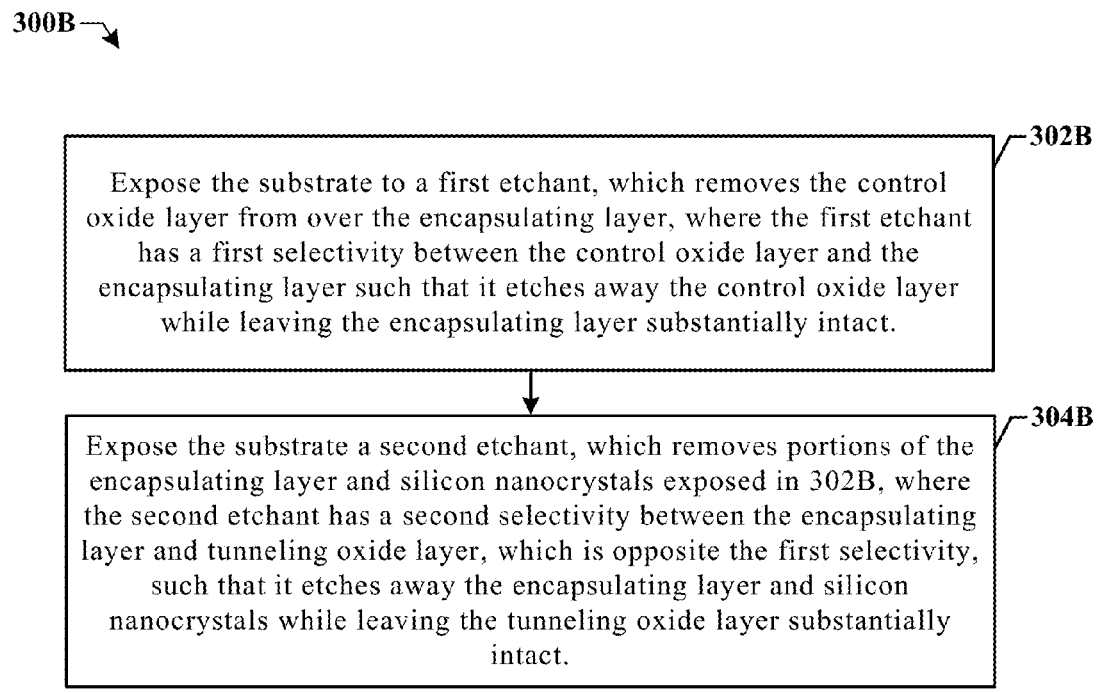

FIG. 3B illustrates a method 300B of etching the charge-trapping layer of FIG. 3A.

At 302B the substrate is exposed to a first etchant, which removes the control oxide layer from over the encapsulating layer. The first etchant has a first selectivity between the control oxide layer and the encapsulating layer such that it etches away the control oxide layer while leaving the encapsulating layer substantially intact. In some embodiments, the encapsulating layer comprises silicon nitride (SiN), the control oxide layer comprises silicon dioxide ($SiO_2$), and the first etchant comprises hydrofluoric acid (HF).

At 304B the substrate is exposed to a second etchant, which removes portions of the encapsulating layer and silicon nanocrystals exposed in 302B. The second etchant has a second selectivity between the encapsulating layer and tunneling oxide layer, which is opposite the first selectivity, such that it etches away the encapsulating layer while leaving the tunneling oxide layer substantially intact. In some embodiments, the encapsulating layer comprises silicon nitride (SiN), the tunneling oxide layer comprises silicon dioxide ($SiO_2$), and the second etchant comprises a plasma of one or more hydrofluorocarbons (CxHyFz) and oxygen ($O_2$).

Figure 4:
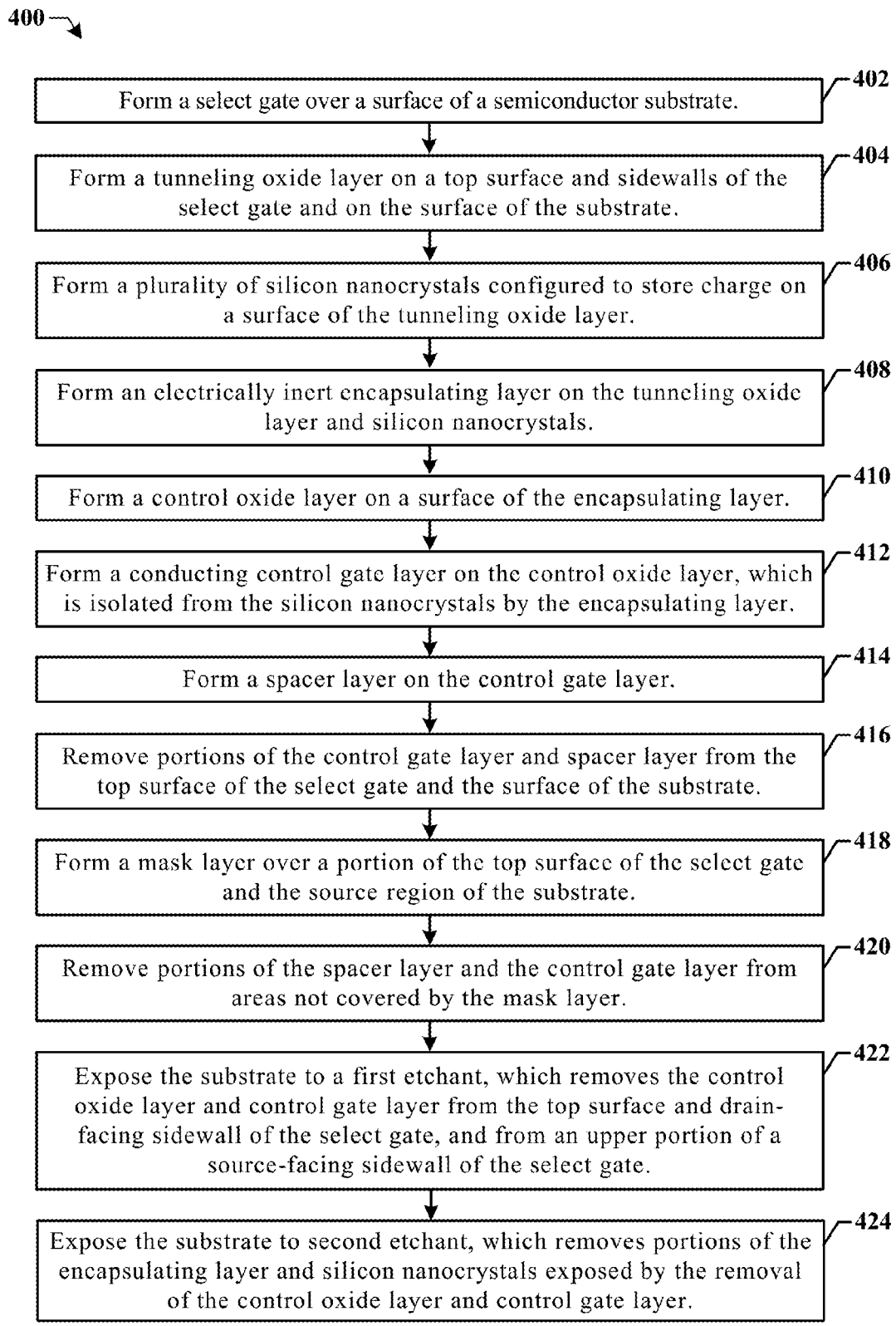
FIG. 4 illustrates a method of forming the memory device of FIGS. 1A-1B.

FIG. 4 illustrates a method 300 of forming the memory device of FIGS. 1A-1B.

At 402 a select gate is formed over a surface of the substrate.

At 404 a tunneling oxide layer is formed on a top surface and sidewalls of the select gate and on the surface of the semiconductor substrate.

At 406 a plurality of silicon nanocrystals configured to store charge are formed on a surface of the tunneling oxide layer.

At 408 an encapsulating layer is formed on the tunneling oxide layer and silicon nanocrystals, which covers the silicon nanocrystals, fills spaces between adjacent silicon nanocrystals, and fills spaces between the silicon nanocrystals and the tunneling oxide layer.

At 410 a control oxide layer is formed on a surface of the encapsulating layer.

At 412 a conducting control gate layer is formed on the control oxide layer, which is isolated from the silicon nanocrystals by the encapsulating layer.

At 414 a spacer layer is formed on the control gate layer.

At 416 portions of the control gate layer and spacer layer are removed from the top surface of the select gate and the surface of the semiconductor substrate.

At 418, after removing portions of the control gate layer and spacer layer, a mask layer is formed over a portion of the top surface of the select gate and the source region of the semiconductor substrate.

At 420 portions of the spacer layer and the control gate layer are removed from areas not covered by the mask layer.

At 422, after removing portions of the spacer layer and the control gate layer, the substrate is exposed to a first etchant (e.g., a wet HF dip), which removes the control oxide layer (e.g., $SiO_2$) and control gate layer (e.g., polysilicon) from the top surface and drain-facing sidewall of the select gate, and from an upper portion of a source-facing sidewall of the select gate. The first etchant has a first selectivity (e.g., 1-20×) between the control oxide layer and the encapsulating layer (e.g., SiN) such that it etches away the control oxide layer while leaving the encapsulating layer substantially intact.

At 424, after exposing the substrate to a first etchant, the substrate to a second etchant (e.g., a remote CxHyFz and $O_2$ plasma generated in a CDE process), which removes portions of the encapsulating layer and silicon nanocrystals exposed by the removal of the control oxide layer and control gate layer. The second etchant has a second selectivity (e.g., 1-20×) between the encapsulating layer and tunneling oxide layer, which is opposite the first selectivity, such that it etches away the encapsulating layer while leaving the tunneling oxide layer substantially intact.

Therefore, some embodiments of the present disclosure relate to a memory cell with a charge-trapping layer of nanocrystals, comprising a tunneling oxide layer along a select gate, a control oxide layer formed between a control gate and the tunnel oxide layer, and a plurality of nanocrystals arranged between the tunneling and control oxide layers. An encapsulating layer isolates the nanocrystals from the control oxide layer. Contact formation to the select gate includes a two-step etch. A first etch includes a selectivity between oxide and the encapsulating layer, and etches away the control oxide layer while leaving the encapsulating layer intact. A second etch, which has an opposite selectivity of the first etch, then etches away the encapsulating layer while leaving the tunneling oxide layer intact. As a result, the control oxide layer and nanocrystals are etched away from a surface of the select gate, while leaving the tunneling oxide layer intact for contact isolation.

Some embodiments relate to a memory device made up of a plurality of memory cells, wherein a memory cell comprises a charge-trapping layer arranged between a control gate and a select gate. The charge-trapping layer comprises a tunneling oxide layer formed between the control gate and the select gate along a surface of the select gate sidewall. The charge-trapping layer further comprises a control oxide layer formed between the control gate and the select gate along a surface of the control gate sidewall. The charge-trapping layer further comprises a plurality of spherically-shaped silicon nanocrystals arranged between the tunneling oxide layer and the control oxide layer along a surface of the tunnel oxide layer, and an encapsulating layer, which isolates the control oxide layer from the silicon nanocrystals.

Other embodiments relate to a memory device, comprising a select gate formed over a surface of a semiconductor substrate between source and drain regions that are laterally separated by a channel region formed beneath the select gate. A control gate formed is formed along a portion of a sidewall of the select gate, and a charge-trapping layer is formed, which separates the control gate from the select gate. The charge-trapping layer comprises a tunneling oxide layer formed along surfaces of the select gate and the surface of a semiconductor substrate between the select gate and the source and drain regions. The charge-trapping layer further comprises a plurality of nanocrystals formed along a surface of the tunneling oxide layer along a lower portion of a sidewall of the select gate that faces the source region, and over the tunneling oxide layer between the select gate and source region. The nanocrystals are configured to store different amounts of charge depending on what bias is applied over the select and the control gates. The charge-trapping layer further comprises an insulating encapsulating layer which embeds the nanocrystals, and which is isolated from the select gate by the tunneling oxide layer. A control oxide layer is formed along a surface the encapsulating layer, which isolates the encapsulating layer from the control gate.

Still other embodiments relate to a method of forming a memory device on a semiconductor substrate, comprising forming a select gate over a surface of the substrate, forming a tunneling oxide layer on a top surface and sidewalls of the select gate and on the surface of the semiconductor substrate, and forming a plurality of silicon nanocrystals configured to store charge on a surface of the tunneling oxide layer. An encapsulating layer is formed on the tunneling oxide layer and silicon nanocrystals, which covers the silicon nanocrystals, fills spaces between adjacent silicon nanocrystals, and fills spaces between the silicon nanocrystals and the tunneling oxide layer. A control oxide layer is formed on a surface of the encapsulating layer. A conducting control gate layer is formed on the control oxide layer, which is isolated from the silicon nanocrystals by the encapsulating layer. A spacer layer is then formed on the control gate layer.

While method 300 has been described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Further, spatially relative terms, such as "over," "on," "beneath," "below," "lower," "above," "upper" and the like, have been used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device made up of a plurality of memory cells on a semiconductor substrate, wherein a memory cell comprises a charge-trapping layer arranged between a control gate and a select gate, wherein the charge-trapping layer comprises:

a tunneling oxide layer formed between the control gate and the select gate along a surface of a select gate sidewall, the tunneling oxide extending upwardly to cover a top surface of the select gate;

a control oxide layer formed between the control gate and the select gate along a surface of a control gate sidewall;
a plurality of spherically-shaped silicon nanocrystals arranged between the tunneling oxide layer and the control oxide layer along a surface of the tunnel oxide layer; and
an insulating encapsulating layer, which isolates the control oxide layer from the silicon nanocrystals and the tunnel oxide layer.

2. The memory device of claim 1, further comprising a pair of the memory cells having a shared common source region.

3. The memory device of claim 2, wherein:
the tunneling oxide layer within each memory cell forms a continuous shape along the sidewall of the select gate and over a surface of the semiconductor substrate between the select gate and the common source;
the encapsulating layer within each memory cell forms a continuous shape along a lower portion of the sidewall and over the surface between the select gate and the common source, and is separated from the sidewall and surface by the tunneling oxide layer; and
the control oxide layer within each memory cell forms a continuous shape along the lower portion of the sidewall and over the surface of the semiconductor substrate between the select gate and the common source, and has an upper surface aligned with a planar upper surface of the control gate.

4. The memory device of claim 1, wherein the encapsulating layer comprises silicon nitride (SiN) and has a thickness in a range of about 1 nm to about 10 nm.

5. The memory device of claim 1, wherein:
the silicon nanocrystals are distributed randomly within the encapsulating layer such that a distance between adjacent silicon nanocrystals varies throughout the encapsulating layer;
the silicon nanocrystals abut the surface of the tunneling oxide layer; and
the tunneling oxide layer and encapsulating layer in combination completely embed and surround the plurality of nanocrystals and isolate them from both the select gate and the control gate.

6. A memory device, comprising:
a select gate formed over a surface of a semiconductor substrate between source and drain regions that are laterally separated by a channel region formed beneath the select gate;
a control gate formed along a portion of a sidewall of the select gate and over the surface of the semiconductor between the select gate and the source and drain regions, wherein a sidewall spacer is disposed along a sidewall of the control gate; and
a charge-trapping layer having a sidewall aligned with an outer sidewall of the sidewall spacer, which separates the control gate from the select gate, comprising:
a tunneling oxide layer formed along surfaces of the select gate and the surface of the semiconductor substrate between the select gate and the source and drain regions;
a plurality of nanocrystals formed along a surface of the tunneling oxide layer along a lower portion of a sidewall of the select gate that faces the source region, and over the tunneling oxide layer between the select gate and source region, and configured to store different amounts of charge depending on what bias is applied over the select and the control gates;
an insulating encapsulating layer which embeds the nanocrystals, and which is isolated from the select gate by the tunneling oxide layer; and
a control oxide layer formed along a surface the encapsulating layer, which isolates the encapsulating layer from the control gate.

7. The memory device of claim 6, wherein the nanocrystals comprise spherically-shaped silicon nanocrystals that are distributed randomly within the encapsulating layer such that a distance between adjacent nanocrystals varies throughout the encapsulating layer.

8. The memory device of claim 6, wherein the nanocrystals abut a surface of the tunneling oxide layer, and wherein the tunneling oxide layer and encapsulating layer in combination completely embed and surround the nanocrystals to isolate them from both the select gate and the control gate.

9. The memory device of claim 6, wherein the encapsulating layer is continuous layer that covers the nanocrystals, fills areas between adjacent nanocrystals.

10. The memory device of claim 6, wherein:
a first voltage applied to the select gate allows electrons to move between the source and drain regions through the channel region; and
a second voltage applied to the control gate allows the electrons to tunnel from the channel region, through the tunneling oxide layer, and into the nanocrystals, to store charge within the nanocrystals in a write mode of operation of the memory device.

11. The memory device of claim 10, wherein the stored charge within the plurality of nanocrystals increase a threshold voltage of the memory device, which is used to sense stored charge within the plurality of nanocrystals in a read mode of operation of the memory device.

12. The memory device of claim 11, wherein a third voltage applied to the control gate allows the electrons to tunnel from the nanocrystals, through the control oxide layer, and into the control gate, to remove the stored charge from the nanocrystals, in an erase mode of operation of the memory device.

13. A memory device, comprising:
a select gate disposed over a semiconductor substrate between a source region and a drain region that are laterally separated by a channel region formed beneath the select gate;
a "L" shaped control gate comprising a vertical portion disposed along a lower sidewall of the select gate and a lateral portion extended along a surface of the semiconductor substrate between the select gate and the source region; and
a charge-trapping layer, which separates the control gate from the select gate and extends under the control gate, comprising:
a tunneling dielectric layer disposed along a first sidewall surface of the select gate facing the drain region, disposed along a second sidewall surface of the select gate facing the source region and extending continuously under the control gate;
a plurality of nanocrystals disposed along a lower portion of a sidewall surface of the tunneling dielectric layer facing the source region and extending under the control gate;
an encapsulating layer filling spaces between adjacent nanocrystals; and
a control dielectric layer formed along a surface the encapsulating layer;
wherein the encapsulating layer extends over the plurality of nanocrystals and separates the nanocrystals from the control dielectric layer;

wherein the control dielectric layer has an upper surface aligned with a planar upper surface of the control gate.

14. The memory device of claim 13, wherein the encapsulating layer comprises silicon nitride (SiN).

15. The memory device of claim 13, wherein the encapsulating layer has a thickness in a range of about 1 nm to about 10 nm.

16. The memory device of claim 13, wherein the nanocrystals comprise spherically-shaped silicon nanocrystals that are distributed randomly within the encapsulating layer.

17. The memory device of claim 13, wherein the tunneling dielectric layer comprises silicon dioxide ($SiO_2$).

18. The memory device of claim 13, wherein the control dielectric layer comprises silicon dioxide ($SiO_2$).

19. The memory device of claim 13, further comprising:
a first spacer layer lining an upper sidewall of the control gate and sitting on a ledge of the control gate;
wherein the first spacer layer has an outer sidewall aligned with that of the lateral portion of the control gate.

20. The memory device of claim 19, further comprising:
a second spacer layer lining a sidewall of the first spacer and a lower sidewall of the control gate and sitting on an upper surface of the control dielectric layer.

* * * * *